United States Patent [19]

Okuda

[11] Patent Number: 5,982,798
[45] Date of Patent: Nov. 9, 1999

[54] SEMICONDUCTOR LASER AND PROCESS FOR PRODUCTION THEREOF

[75] Inventor: Tetsuro Okuda, Tokyo, Japan

[73] Assignee: NEC Corporation, Tokyo, Japan

[21] Appl. No.: 08/898,108

[22] Filed: Jul. 22, 1997

[30] Foreign Application Priority Data

Jul. 24, 1996 [JP] Japan ..................................... 8-194724
Nov. 26, 1996 [JP] Japan ..................................... 8-314746

[51] Int. Cl.⁶ ....................................................... H01S 3/19
[52] U.S. Cl. .............................. 372/46; 372/45; 372/26; 372/96; 438/33
[58] Field of Search ............................... 372/46, 26, 45, 372/96; 438/33

[56] References Cited

U.S. PATENT DOCUMENTS

| | | | |
|---|---|---|---|
| 4,597,085 | 6/1986 | Mito et al. | 372/45 |
| 4,759,023 | 7/1988 | Yamaguchi | 372/26 |
| 5,390,205 | 2/1995 | Mori et al. | 372/46 |
| 5,452,315 | 9/1995 | Kimura et al. | 372/46 |
| 5,780,320 | 7/1998 | Kinoshita | 438/33 |

OTHER PUBLICATIONS

Haruo Yonetani, et al. "DFB Laser Diode and Module for Analog Application", *Fujitsu Science Technical Journal*, vol. 29, Dec. 1993, pp. 377–389.

"Double–Channel Planar Buried–Heterostructure Laser Diode with Effective Current Confinement", *Electronics Letters*, vol. 18, Oct. 28, 1982, pp. 953–954.

*Primary Examiner*—Rodney Bovernick
*Assistant Examiner*—Sung T. Kim
*Attorney, Agent, or Firm*—Whitham, Curtis & Whitham

[57] ABSTRACT

In a semiconductor laser for analog modulation, intermodulation distortion at high temperatures and/or at high outputs is reduced. In a DC-PBH semiconductor laser, the width (Wm) of the electrode mesa 11 is set at 10 μm or less, and the width of each recombination layer 2 is set at 0.1 μm or more. Further, the distance between one end of the active layer 1 and one end of each current-blocking layer 5 is set at 0.01 μm to 0.5 μm.

4 Claims, 12 Drawing Sheets

SEMICONDUCTOR LASER AND PROCESS FOR PRODUCTION THEREOF

BACKGROUND OF THE INVENTION

1. Field of the Invention

The present invention relates to a semiconductor laser, particularly a high-output semiconductor laser for analog modulation.

2. Description of the Related Art

In recent years, subcarrier multiplexing (analog optical transmission) has been used in mobile communication systems, optical CATV systems, etc. As the light used in the subcarrier multiplexing, a semiconductor laser for analog modulation, having small intermodulation distortion is needed. This semiconductor laser is required to satisfy low distortion properties, i.e. a composite second order distortion (CSO) of −60 dBc or less and a composite triple beat (CTB) of −65 dBc or less in, for example, a 80-channel CATV system when the optical modulation index per channel is 3.5%. Further, the semiconductor laser is required to have a high output of 30 mW or more so that image distribution by one transmitter to as many viewers as possible can be achieved. Furthermore, the semiconductor laser is desired to be usable at a wide temperature range, for example, from −25° C. to 65° C.

As the light source for analog modulation, there have heretofore been widely used distributed feedback semiconductor lasers (DFB lasers) which can easily produce a single-mode oscillation. The DFB lasers, however, have had a problem in that they generate intermodulation distortion caused by the non-linearity of the current-light output property. They have generated large intermodulation distortion particularly at high temperatures and/or at high outputs because the non-linearity of the current-light output property is made conspicuous by the high-frequency leakage current, the leakage current flowing near the active layer and the light output saturation of laser caused by the insufficient breakdown voltage of the current-blocking layers.

To overcome the above problems, there is described a technique of forming an electrode mesa of narrow width for a lower device capacitance and thereby reducing the intermodulation distortion caused by leakage current, in, for example, FUJITSU SCIENTIFIC AND TECHNICAL JOURNAL, VOL. 29. NO. 4, DECEMBER, 1993. FIG. 15 is a conventional semiconductor laser. FIG. 15(a) shows a semiconductor laser of PBH (planar buried heterostructure) type. In FIG. 15(a), an active layer 1 is buried by a p-InP current-blocking layer 4, n-InP current-blocking layers 5 and a p-InP buried layer 6. In such a structure, the junction capacitance of the current-blocking layers cause leakage current; however, it is reported that the leakage current can be suppressed and reduction in intermodulation distortion is made possible by setting the width of the portion determined by an electrode mesa 11, i.e. the width (Wm) of the electrode mesa, at 7 µm or less.

Conventional PBH semiconductor lasers, however, have had a problem in that they generate large intermodulation distortion at high temperatures and/or at high outputs. The first reason therefor is that in conventional semiconductor lasers of PBH type, the current-blocking layers have no sufficient voltage breakdown property at high temperatures and/or at high outputs, which makes conspicuous the light output saturation when the current is increased at high temperatures and/or at high outputs. The second reason is that since the high-precision control of the distance between each n-InP current-blocking layer and the active layer 1 is difficult in the process for production of conventional PBH semiconductor laser, the leakage current flowing near the active layer cannot be made sufficiently small, which makes conspicuous the light output saturation when the current is increased at high temperatures and/or at high outputs. Therefore, conventional PBH semiconductor lasers have found no application in, for example, a CATV system whose output exceeds 30 mW; moreover, they have had no sufficient stability in intermodulation distortion at a wide temperature range.

Meanwhile, a DC-PBH (double channel planar buried heterostructure) laser was proposed in, for example, ELECTRONICS LETTERS, VOL. 18, NO. 22, 1982. It is a semiconductor laser as shown in FIG. 15(b), having an active layer 1, one pair of channels 3 provided at the two ends of the active layer 1, and two recombination layers 2 of the same layer structure as the active layer 1, provided outside the channels 3; and is relatively superior in properties at high temperatures and/or at high outputs. This semiconductor laser has a further advantage in that since the distance between the active layer 1 and each n-InP current-blocking layer 5 can be controlled at a high precision, the leakage current flowing near the active layer can be made sufficiently small.

Even in this DC-PBH laser having the above-mentioned properties, however, the intermodulation distortion at high temperatures and/or at high outputs has been insufficient. The reason is that the electrostatic capacitance by the recombination layers 2 is large and it generates a high-frequency leakage current flowing through the recombination layers 2.

SUMMARY OF THE INVENTION

The object of the present invention is to alleviate the above-mentioned problems of the prior art and provide a semiconductor laser for analog modulation, which gives low intermodulation distortion even at high temperatures and/or at high outputs.

In the DC-PBH semiconductor laser of the present invention, the width Wm of the electrode mesa (11 of FIG. 1) is set at 10 µm or less, whereby the leakage current flowing near the active layer is reduced effectively. Further, the width Wm of the electrode mesa (11 of FIG. 1) is set at 5 µm or more, whereby the lower resistance and increased reliability of semiconductor laser device are achieved. Further, the width Wr of each recombination layer (2 of FIG. 1) is set at 0.1 µm or more, whereby the voltage breakdown of each current-blocking layer is improved and the saturation output is improved. Further, the distance between one end of each current-blocking layer (5 of FIG. 1) having the same conduction type (n type) as the substrate and one end of the active layer (1 of FIG. 1) is set at 0.01 µm to 0.5 µm, whereby the leakage current flowing near the active layer is reduced effectively. Further, the width of the electrode mesa at the top of the mesa is made larger than the width of electrode mesa at the position of the layers including the active layer, whereby the lower resistance and improved reliability of semiconductor laser device are achieved.

In the PBH semiconductor laser of the present invention, the current-blocking layers (25 of FIG. 13) are made of Fe-added InP, and the width of the electrode mesa held between the electrode-separating grooves, at the position of the layers including the active layer is set at 12 µm or less, whereby the lower resistance and improved reliability of semiconductor laser device are achieved.

The process for producing a PBH semiconductor laser according to the present invention comprises:

a step of forming, on a substrate, a double heterostructure containing at least an active layer and a cladding layer and then forming, on the resulting semiconductor wafer, a $SiO_2$ thin film, a step of subjecting the desired portions of the $SiO_2$ thin film to etching to form a pattern of $SiO_2$ thin film, a step of subjecting the desired portions of the semiconductor wafer to etching to a depth reaching the substrate by using the pattern of $SiO_2$ thin film as a mask, and then forming, on the substrate exposed by the etching, at least one semiconductor layer which becomes a current-blocking layer, a step of removing the $SiO_2$ thin film and then forming a semiconductor layer on the whole surface of the wafer, and a step of forming, on the wafer, one pair of electrode-separating grooves having a depth reaching the substrate, in such a structure that the active layer and the current-blocking layers provided at the two ends of the active layer are held between said one pair of the electrode-separating grooves.

Therefore, in this process, as compared with the case of producing a conventional PBH structure, the semiconductor layer which becomes a current blocking layer is grown only in the groove, resulting in a higher raw material efficiency and the time for the growth can be shortened significantly. Further, since the place for buried heterostructure growth is small, the distance between each n-InP current-blocking layer and the active layer can be controlled at a high precision and the reproducibility of the buried structure is high. Further, in the above process for production of a PBH semiconductor laser, since each current-blocking layer is made of Fe-added InP, the lower resistance and improved reliability of semiconductor laser device can be achieved.

Also, the process for producing a PBH semiconductor laser according to the present invention comprises:

a step of forming, on a substrate, a DC-PBH structure by buried heterostructure growth, and a step of forming one pair of current-separating grooves having a depth reaching the substrate, which hold an active layer between them, said step including the removal of at least recombination layers by etching.

That is, there is first produced a DC-PBH structure in which the distance between each current-blocking layer and the active layer is controlled at a high precision; then, from the structure is formed a PBH structure. Therefore, the above-mentioned distance can be controlled at a high precision, which enables reduction in leakage current.

Also, the process for producing a DC-PBH semiconductor laser according to the present invention comprises:

a step of forming a DC-PBH structure by buried heterostructure growth, a step of forming one pair of electrode-separating grooves having a depth reaching a substrate, which hold an active layer and recombination layers between them, and a step of subjecting the recombination layers to selective etching.

Therefore, the mesa width at the mesa top can be made large while the mesa width at the position of the layers including the active layer is made small; the leakage current flowing near the active layer can be reduced; and the lower resistance of semiconductor laser device can be achieved.

In the DC-PBH semiconductor laser of the present invention, since the width of the electrode mesa and the width of each recombination layer are optimized, the device capacitance can be reduced and the breakdown voltage of semiconductor laser device can be improved. Further, since the distance between one end of each current-blocking layer of the same conduction type as the substrate and one end of the active layer is controlled at a high precision, the leakage current flowing near the active layer can be reduced effectively. From these, low distortion can be achieved even at high temperatures and/or at high outputs. Further, since the width of the electrode mesa at the mesa top is made larger than the width of the electrode mesa at the position of the layers including the active layer, the lower resistance of semiconductor laser device can be achieved.

In the PBH semiconductor laser of the present invention, since each current-blocking layer is made of Fe-added InP, the width of the electrode mesa can be made large and the lower resistance of semiconductor laser device can be achieved.

In the process for producing a PBH semiconductor laser according to the present invention, since a current-blocking layer is grown in each groove provided near the active layer, the raw material efficiency can be increased and the time for the growth can be shortened. Further, since the place for the growth is small, the distance between each n-InP current-blocking layer and the active layer can be controlled at a high precision, and the reproducibility of the buried (grown) structure is high.

Also in the process for producing a PBH semiconductor laser according to the present invention, since the PBH structure used is produced from a DC-PBH structure wherein the distance between each current-blocking layer and the active layer is controlled at a high precision, the leakage current can be reduced.

In the process for producing a DC-PBH semiconductor laser according to the present invention, since the process includes a step of subjecting the recombination layers to selective etching, the width of the mesa at the position of the layers including the active layer can be made small and the width of the mesa at its top can be made large, the leakage current flowing near the active layer can be reduced, and the lower resistance of semiconductor laser device can be achieved.

DETAILED DESCRIPTION OF THE PREFERRED EMBODIMENTS

Detailed description is made below on the embodiments of the present invention with reference to the accompanying drawings. FIG. 1 schematically shows the sectional structure of an example of the semiconductor laser of the present invention. An active layer 1 is buried in a DC-PBH structure by p-InP current-blocking layers 4, n-InP current-blocking layers 5 and a p-InP buried layer 6. An electrode mesa 11 formed between electrode-separating grooves 8 having a depth reaching an n-InP substrate 12 includes the active layer 1 and recombination layers 2 having the same layer structure as the active layer 1.

Next, the properties of the semiconductor laser of FIG. 1 are described with reference to FIG. 2. FIG. 2 shows a relation between the width (Wm of FIG. 1) of electrode mesa and the CSO at 30 mW light output when modulation was made by the signal of 80-channel CATV. The CSO was calculated by replacing the DC-PBH with an electrically equivalent circuit. In the calculation was used a structure in which the width (Wa of FIG. 1) of the active layer was 1.5 $\mu$m and the ratio of channel width (Wch of FIG. 1) and recombination layer width (Wr of FIG. 1) was Wch:Wr=1:1. Further, as the width between one end of each n-InP current-blocking layer and one end of the active layer, i.e. the leakage current path width near active layer, there was used 0.2 μm. As is clear from FIG. 2, a larger electrode mesa width tends to give a larger CSO. This is because a larger electrode mesa width results in larger capacities of recombination layers and pn junctions and a larger high-frequency leakage current. According to the calculation, the electrode mesa width, i.e. the electrode mesa width (Wm of FIG. 1) at the position of the layers including the active layer must be smaller than 10 μm in order to satisfy CSO<−60 dBc.

FIG. 3(a) shows a relation of current and light output when leakage current was taken into account, obtained by calculation in the semiconductor laser of FIG. 1. The relation was obtained by calculation by taking the recombination layer width (Wr) as a parameter and by using a two-dimensional optical device simulator. The calculation was made on a semiconductor laser device in which the active layer width (Wa) and the electrode mesa width (Wm) were 1.5 μm and 10 μm, respectively, the width between each n-InP current-blocking layer and the active layer, i.e. the leakage current path width near active layer was 0.2 μm, and each channel width (Wch) and each recombination layer width (Wr) were varied. FIG. 3(b) shows a relation of the above recombination layer width (Wr) and the CSO obtained based on the linearity of the current-light output relation obtained by calculation. As is clear from FIG. 3(b), a larger recombination layer width (Wr) results in a smaller CSO. This is because when the recombination layer width is larger, the breakdown voltage of each current-blocking layer is higher, the saturation light output is larger, and the linearity of the current-light output relation is improved. A conventional PBH laser corresponds to a case of Wr=0 in FIG. 3(b) and cannot satisfy CSO<−60 dBc. This is because in a conventional PBH laser, the breakdown voltage of each current-blocking layer is not sufficient and the saturation light output is low. Meanwhile, in the DC-PBH laser, by making each recombination layer width (Wr) larger than 0.1 μm, the breakdown voltage of each current-blocking layer is improved and CSO<−60 dBc can be satisfied. When the width of each recombination layer is increased, there is an advantage that the breakdown voltage of each current-blocking layer is improved and the CSO decreases, but simultaneously there is a disadvantage that a high-frequency leakage current flowing through each recombination layer appears and the CSO increases. However, when the electrode mesa width (Wm) is made small (10 μm), the effect brought about by the improvement of the breakdown voltage of each current-blocking layer is larger than the effect brought about by the high-frequency leakage current and, as a result, the CSO decreases as seen in FIG. 3(b). That is, it is preferable from the standpoint of CSO reduction that the electrode mesa width (Wm) is set at 10 μm or less to make small the electrostatic capacitance and, in addition, each recombination layer width (Wr) is made as large as possible. Incidentally, since the electrode mesa width (Wm), the active layer width (Wa), each channel width (Wch) and each recombination layer width (Wr) satisfy the following relation:

$$Wm=Wa+2\times Wch+2\times Wr$$

each recombination layer width (Wr) inevitably has the upper value when the electrode mesa width (Wm) is set at 10 μm or less. In summarizing the above statement, by making the electrode mesa width (Wm) smaller than 10 μm and each recombination layer width (Wr) larger than 0.1 μm, a semiconductor laser satisfying CSO<−60 dBc at a light output of 30 mW can be achieved.

The semiconductor laser of FIG. 1 has first current-blocking layers having a conduction type different from that of the substrate, i.e. p-InP current-blocking layers 4; and second current-blocking layers having the same conduction type as the substrate, i.e. n-InP current-blocking layers 5. Here, the leakage current flowing between each n-InP current-blocking layer 5 and the active layer 1 causes intermodulation distortion as well. FIG. 4 shows a relation of the width between each n-InP current-blocking layer 5 and the active layer 1 (the width is hereinafter referred to as "leakage current path width near active layer) and the CSO when the light output was 30 mW, which relation was obtained by calculation using a two-dimensional optical device simulator. In this case, each recombination layer width was taken at 0.1 μm and the electrode mesa width was taken at 7 μm. According to this calculation, a larger leakage current path width near active layer gives a larger CSO. It is also clear that the leakage current path width near active layer must be smaller than 0.5 μm in order to satisfy CSO<−60 dBc. Therefore, it is necessary to control the leakage current path width near active layer at a high precision. Incidentally, the leakage current path width near active layer must not be 0 μm. That is, one end of each second current-blocking layer and one end of the active layer must not be in contact with each other. It is because with the mutual contact, the current-blocking layer is unable to perform its function. The leakage current path width near active layer can be, for example, 0.01 μm or more.

A smaller electrode mesa width decreases intermodulation distortion at high outputs but, simultaneously therewith, makes smaller the electrode contact area and invites an increased resistance and reduced reliability of semiconductor laser device. When an InGaAsP cap layer having a 1.2 μm bandgap composition is used, the relation of device resistance and window for ohmic contact is as shown in FIG. 5. Since a device resistance of 6Ω or less causes no problem in reliability, etc., the window for ohmic contact must be at least 5 μm. Therefore, the electrode mesa width at the mesa top, i.e. the electrode mesa top width is preferably at least 5 μm. The electrode mesa top width is more preferably at least 7 μm when a mask alignment precision of 1 μm is taken into account.

A smaller electrode mesa top width has, on the other hand, a problem in that the tolerance of mask alignment is decreased in formation of window for ohmic contact. Therefore, in view of the precision and fluctuation of the process employed, it is desirable that while the electrode mesa width is made small to reduce the device capacitance, the electrode mesa top width is made as large as possible. To achieve this, an approach is considered in which the material for current-blocking layer is changed to a Fe-added InP of lower capacitance to obtain significant reduction in device capacitance without making the electrode mesa width extremely small. Here, the Fe-added InP refers to Fe-doped InP. FIG. 6 shows the dependency of CSO on electrode mesa width, of a laser using Fe-added InP current-blocking layers, obtained by the calculation made under the same conditions as in FIG. 2. As is clear from FIG. 6, when Fe-added InP current-blocking layers are used, CSO<−60 dBc is satisfied by setting the electrode mesa width at 12 μm or less. Therefore, in a laser using Fe-added InP current-blocking layers, as compared with the case of a conventional DC-PBH or PBH semiconductor laser, the distortion is small even in a large electrode mesa top width, which makes easy the process for formation of window for ohmic contact.

Besides the above approach, an approach is also effective in which while the electrode mesa top width is kept large, only the electrode mesa width in the layers including the active layer is made small. By subjecting the InGaAsP recombination layers near the active layer to selective etching to make small the electrode mesa width only in the layers including the active layer, intermodulation distortion can be reduced while the window for ohmic contact is kept large.

EXAMPLES

The first example of the present invention is described in detail with reference to FIGS. 7, 8 and 9. As shown in FIG. 7(a), on an n-InP substrate 12 on which a diffraction grating 13 of 202.7 nm period was formed by holographic lithography, were formed, by MOVPE, an n-InGaAsP optical guide layer 14 of 1.05 µm bandgap formulation in thicknesses of 100 nm, an active layer 1 and a p-InP cladding layer 15 in this order. The active layer 1 had a multi quantum well structure obtained by forming, on both sides of a 6.2 nm-thick well layer having a 1.4 µm bandgap composition, a 10 nm-thick barrier layer having a 1.05 µm bandgap composition, repeating this operation 7 times, and forming, on the player side of the resulting material, a 90 nm-thick SCH layer having a 1.05 µm bandgap composition and, on the n layer side of the material, a 40 nm-thick SCH layer having the same composition. On the thus-obtained wafer was formed channels 3 each having a width of 3 µm, by etching, as shown in FIG. 7(b). At this time, the width of the active layer is determined by the distance between the channels 3, and it was 1.5 µm. Then, by LPE were grown p-InP current-blocking layers 4, n-InP current-blocking layers 5, a p-InP buried layer 6 and a p-InGaAsP cap layer 7 having a 1.2 µm bandgap composition; as shown in FIG. 7(c). As seen in FIG. 8(a), the thus-obtained wafer was subjected to etching by photolithography to form electrode-separating grooves 8. At this time, part of the wafer portion beneath the photoresist 16 used underwent etching simultaneously. In this example, etching was terminated when the width (Wm) of the electrode mesa 11 reached 10 µm. Under this condition, the width (Wr) of each recombination layer was 1.2 µm and the leakage current path width near active layer was 0.2 µm. Next, as shown in FIG. 8(b), a SiO$_2$ oxide film 9 was formed and then a window 17 for ohmic contact was formed by etching. Thereafter, a p-side electrode 10 was formed by vapor deposition; and the substrate was polished and a n-side electrode was formed thereon. The p-side electrode 10 was processed by ion milling so as to have a pad shape, as shown in FIG. 9. The resulting wafer was cleaved so as to have a cavity length of 300 µm; a low-reflectivity film 18 was formed on one side of the resulting material and a high-reflectivity film 19 was formed on the other end, both by coating; and cutting was conducted to obtain a chip. The appearance of the chip is shown in FIG. 9. The thus-obtained device was mounted on a chip carrier and measured for intermodulation distortion by modulation with a signal used in a 80-channel CATV system where the light modulation index per channel was 3.5%. As a result, the CSO was −65 dBc and the CTB was −75 dBc at a light output of 30 mW. With a conventional semiconductor laser produced for comparison, the CSO was −55 dBc and the CTB was −65 dBC. The dependency of intermodulation distortion on temperature was measured. As a result, CSO<−55 dBc was obtained from −20° C. to 80° C. with the semiconductor laser of the present example, while CSO<−55 dBc was obtained only from −20° C. to 50° C. with the conventional semiconductor laser.

Then, the second example of the present invention is described with reference to FIGS. 10 and 11. As shown in FIG. 10(a), an optical guide layer, a strained multi quantum well active layer 20 and a p-InP cladding layer were formed by MOVPE in the same manner as in the first example. The strained multi quantum well active layer had a structure obtained by forming, on both sides of a 5 nm-thick strained well layer having a 1.29 µm bandgap composition, a 10 nm-thick barrier layer having a 1.05 µm bandgap composition, repeating this operation 7 times, and forming, on the p layer side of the resulting material, a 90 nm-thick SCH layer having a 1.05 µm bandgap composition and, on the n layer side of the material, a 40 nm-thick SCH layer having the same composition. Successively, by LPE were grown p-InP current-blocking layers 4, n-InP current-blocking layers 5, a p-InP buried layer 6 and a p-InGaAsP cap layer. The p-InGaAsP cap layer was removed by etching, after which there were formed, by MOVPE, a first p-InGaAsP cap layer 21 having a 1.2 µm bandgap composition and a second p-InGaAsP cap layer 22 having a 1.5 µm bandgap composition. This can reduce the resistance of the semiconductor laser obtained, whereby the heat generated at high light outputs can be suppressed and the leakage current generated at high outputs can be reduced. Further, since the time constant of device determined by device capacitance and device resistance can be made small, improved response speed is obtained. Then, as shown in FIG. 10(b), the thus-obtained wafer was subjected to etching by photolithography using a photoresist 16 as a mask to form electrode-separating grooves 8. At this time, the etching time was longer than in the first example and the etching was terminated when the electrode mesa width reached 7 µm. In the etching, the recombination layers were completely removed and a PBH structure as shown in FIG. 10(b) was obtained. Then, a p side electrode and an n side electrode were formed at the same positions as in the first example. Next, as shown in FIG. 11, ion milling was applied to allow the p side electrode 10 to have a pad shape. At this time, the pad electrode was formed only at one side of the electrode mesa stripe. This can achieve a smaller electrode area and a smaller device capacitance. The resulting wafer was cleaved so as to have a cavity length of 300 µm; a low-reflectivity film 18 was formed on one side of the resulting material and a high-reflectivity film 19 was formed on the other end, both by coating; and cutting was conducted to obtain a chip. The thus-obtained device was mounted on a chip carrier and measured for intermodulation distortion by modulation with the above-mentioned signal of 80-channel optical CATV system. As a result, CSO<−60 dBc and CTB<−70 dBc were obtained in a light output range of 10 mW to 25 mW. With a conventional PBH laser, CSO<−60 dBc was obtained only in a light output range of 10 mW to 20 mW. Thus, with the device obtained above, the above CSO level was possible even at a light output higher by about 5 mW. Comparison of the section of the device of the present example with that of the conventional PBH laser indicated that while the distance between the n-InP current-blocking layer and the active layer was 0.7 µm in the conventional PBH laser, the distance was 0.3 µm in the semiconductor laser of the present example. In the present example, since there was used a PBH structure produced from a DC-PBH structure in which the distance between n-InP current-blocking layer and active layer can be controlled at a high precision, the distortion property was superior to that of the conventional PBH laser although the recombination layers were completely removed. Further in the present example, the device resistance was in a range of 5.5 W to 6 W owing to the use of a plurality of cap layers, although the window width for ohmic contact was small at 5 µm.

The third example of the present invention is described with reference to FIG. 12. First, an active layer-containing DH wafer (a wafer comprising a substrate and an active layer-containing semiconductor layer of DH structure, formed on the substrate) was produced in the same manner as in the first example. Subsequently, as shown in FIG. 12(a), a $SiO_2$ film was formed on the DH wafer and then subjected to partial etching (3 strained intervals) by photolithography to obtain a $SiO_2$ mask 23. Using the $SiO_2$ mask 23, grooves 24 were formed by etching, as shown in FIG. 12(b). At this time, the width of mesa held between the grooves 24 was about 1.5 strained. Then, as shown in FIG. 12(c), in each groove 24 were formed, by MOVPE, a p-InP current-blocking layer 4 and an n-InP current-blocking layer 5 in this order. With this structure, as compared with the case of ordinary PBH structure, since semiconductor layers are grown only in the grooves, the raw material efficiency can be made high and the growth time can be shortened significantly. Further, since the area for growth is small, the distance between the n-InP current-blocking layer 5 and the active layer 1 can be controlled at a high precision and the shape reproducibility of the grown layers is high. Next, as shown in FIG. 12(d), the $SiO_2$mask 23 was removed and a p-InP buried layer 6 and a p-InGaAsP cap layer 7 were formed. For the thus-formed wafer was formed an electrode mesa 11 in the same manner as in the first example, as shown in FIG. 12(e). The width of the mesa was 7 strained. The resulting device was mounted on a chip carrier and measured for intermodulation distortion by modulation with the above-mentioned signal of 80-channel optical CATV system. As a result, CSO<−62 dBc and CTB<−70 dBc were obtained in a light output range of 10 mW to 25 mW. In the present example, since the distance between the n-InP current-blocking layer and the active layer was 0.2 strained, the distortion property was improved.

The fourth example of the present invention is described with reference to FIG. 13. First, an active layer-containing DH wafer was produced in the same manner as in the first example. Then, in the same manner as in the third example, grooves 24 were formed by etching using a $SiO_2$ mask. Thereafter, as shown in FIG. 13(a), a Fe-added InP layer 25 was formed in each groove 24 by MOVPE. As shown in FIG. 13(b), the $SiO_2$ mask was removed and there were grown, by MOVPE, a p-InP buried layer 6 and a p-InGaAsP cap layer 7 having a 1.2 μm bandgap composition. As shown in FIG. 13(c), electrode-separating grooves 8 were formed by etching in the same manner as in the first example. At this time, the electrode mesa width at the mesa top was set at 12 strained and the electrode mesa width at the active layer position happened to be 12 strained as well. The window width for ohmic contact was set at 10 strained. The thus-formed wafer was cut into a chip in the same manner as in the first example. The chip was measured for intermodulation distortion in the same manner as in the first example. As a result, the CSO was −65 dBc and the CTB was −75 dBc at a light output of 30 mW. The resistance of the device was in a range of 5 Ω to 5.5 Ω (about 5.5 Ω to 6 Ω in the device of the first example) because the window width for ohmic contact was large.

The fifth example of the present invention is described with reference to FIG. 14. First, an active layer-containing DH wafer was produced in the same manner as in the first example. Successively, a DC-PBH structure was formed by LPE. Then, as shown in FIG. 14(a), electrode-separating grooves 8 were formed by etching in the same manner as in the first example. At this time, however, etching was once terminated when the electrode mesa width at the mesa top became 18 strained. Successively, only the InGaAsP layers near the active layer were subjected to etching using a sulfuric acid-hydrogen peroxide-water mixed solution, as shown in FIG. 14(b). At this time, the mixing ratio of sulfuric acid, hydrogen peroxide and water was 3:1:1 and etching was conducted at 30° C. for 4 minutes, whereby the width of each InGaAsP layer became 3 strained. Then, etching of electrode mesa was continued until the electrode mesa top width became 15 strained. Thereby, as shown in FIG. 14(c), the electrode mesa width at the layers including the active layer became about 10 strained and the electrode mesa width at the mesa top became 15 strained. Thereafter, an electrode was formed by vapor deposition while the window width for ohmic contact was set at 10 strained. At this time, the precision of alignment required in the process for formation of window for ohmic contact was mild (2.5 strained or less) because the window width for ohmic contact was set at 10 μm relative to the electrode mesa top width (15 μm). The subsequent operation was conducted in the same manner as in the first example to obtain a wafer. The wafer was cut into a chip. The chip was measured for intermodulation distortion in the same manner as in the first example. As a result, the CSO was −67 dBc and the CTB was −77 dBc at a light output of 30 mW. The resistance of the device was in a range of 5 Ω to 5.5 Ω.

In the above examples of the present invention, description was made only on DFB lasers. It is apparent, however, that there is no restriction as to the structure of the diffraction grating used and that the present invention can be applied also to Fabry-Perot type semiconductor lasers.

Figure 1:
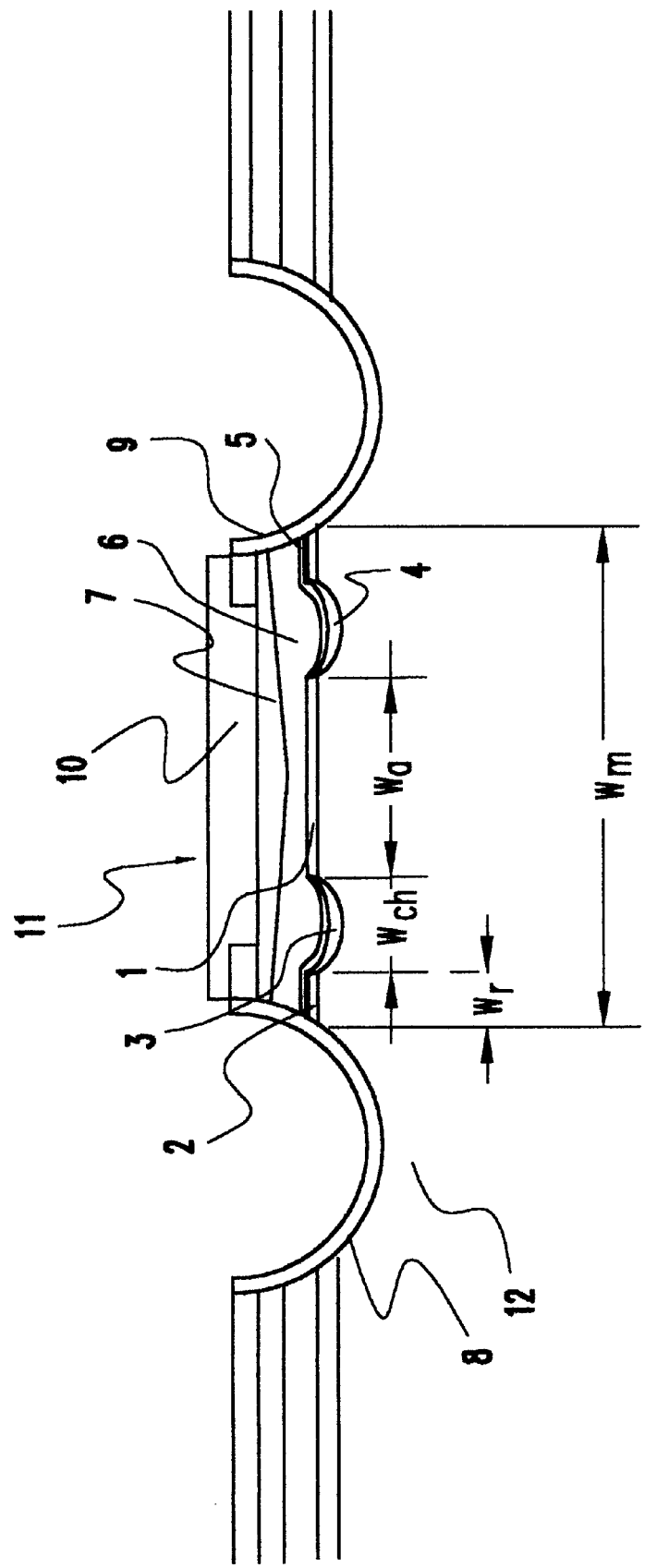
FIG. 1 is a schematic drawing showing the sectional structure of an example of the semiconductor laser of the present invention.
Figure 2:
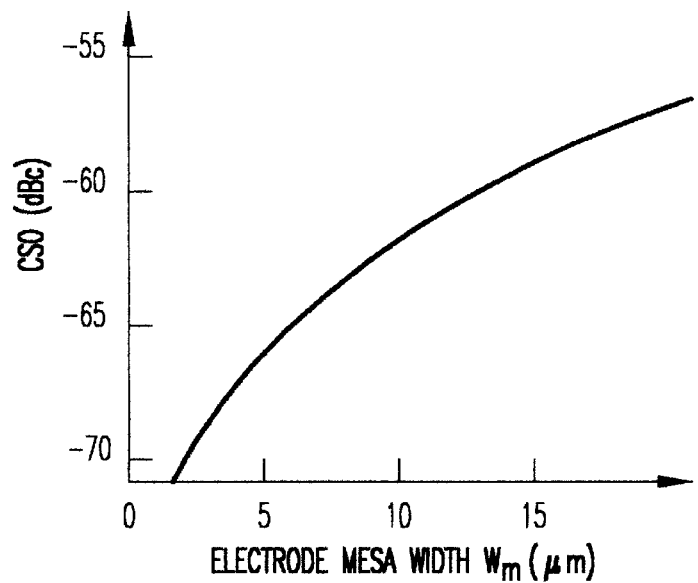
FIG. 2 is a graph showing a relation of electrode mesa width and composite second order distortion, obtained with the semiconductor laser of FIG. 1.
Figure 3A:
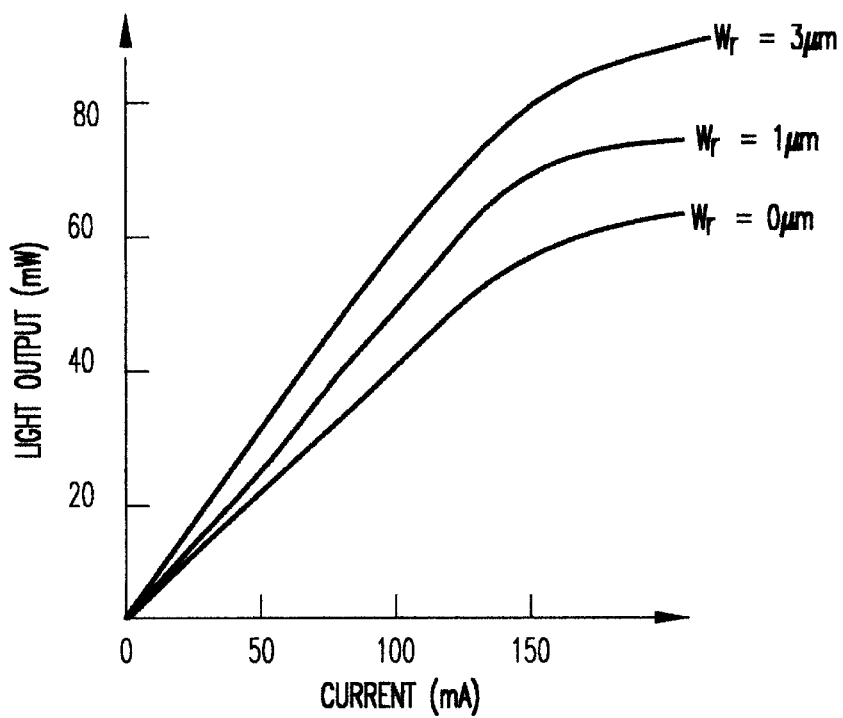
FIG. 3(a) is a graph showing the effect of recombination layer width on current-light output relation, obtained with the semiconductor laser of FIG. 1.
Figure 3B:
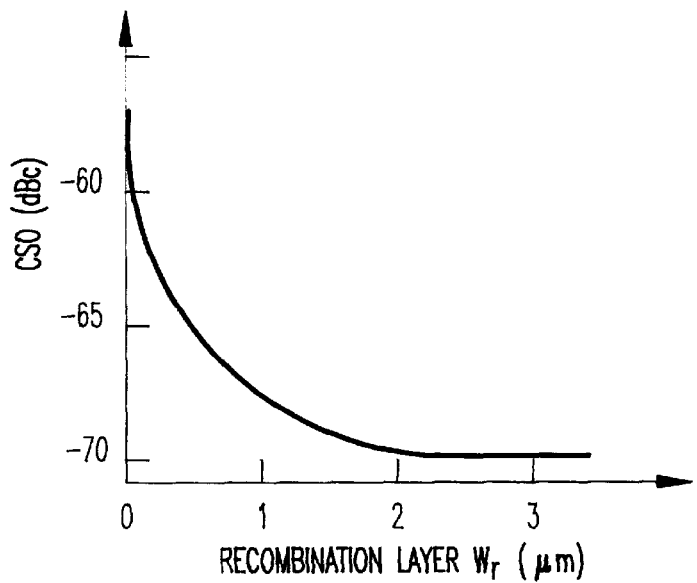
FIG. 3(b) is a graph showing a relation of recombination layer width and composite second order distortion, obtained with the semiconductor laser of FIG. 1.
Figure 4:
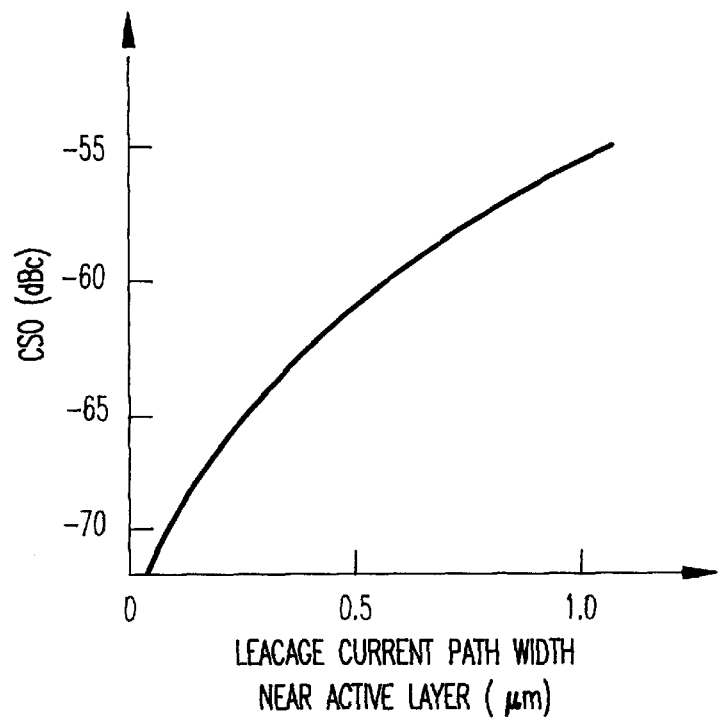
FIG. 4 is a graph showing a relation of leakage current path width near active layer and composite second order distortion, obtained with the semiconductor laser of FIG. 1.
Figure 5:
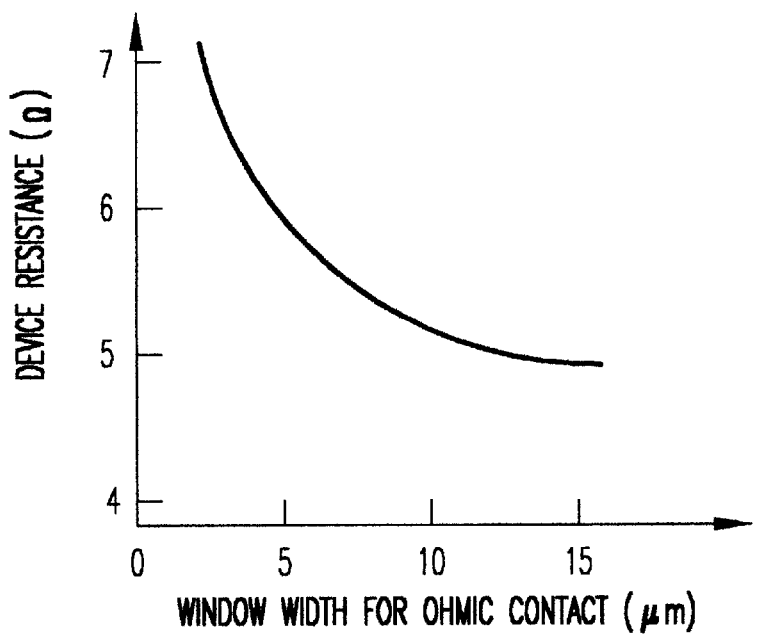
FIG. 5 is a graph showing a relation of window width for ohmic contact and device resistance, obtained with the semiconductor laser.
Figure 6:
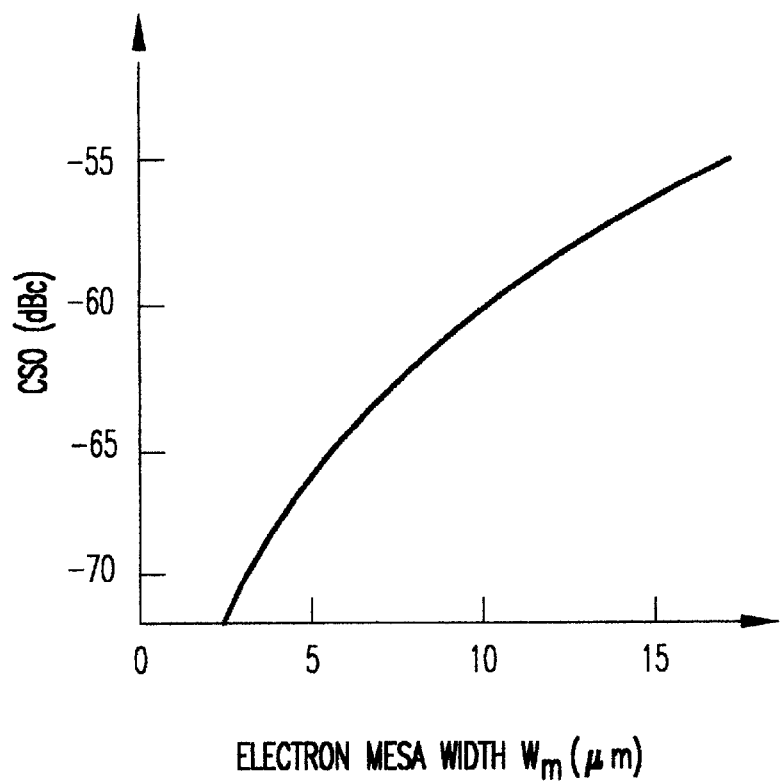
FIG. 6 is a graph showing a relation of electrode mesa width and composite second order distortion when the current-blocking layers were made of Fe-added InP in the semiconductor laser of FIG. 1.
Figure 7A:
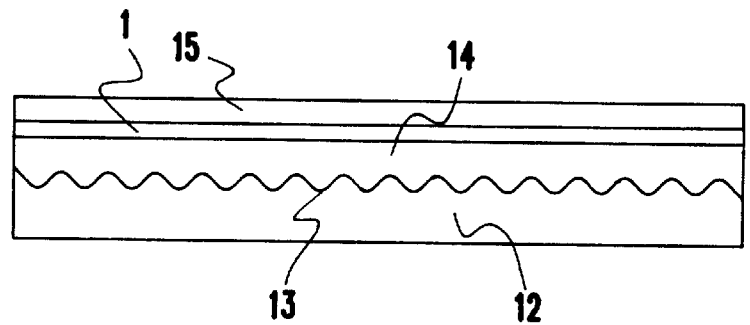
FIGS. 7(A), 7(B) and 7(C) illustrate schematic sectional drawings for explaining a process for production of a semiconductor laser of the present invention.
Figure 7B:
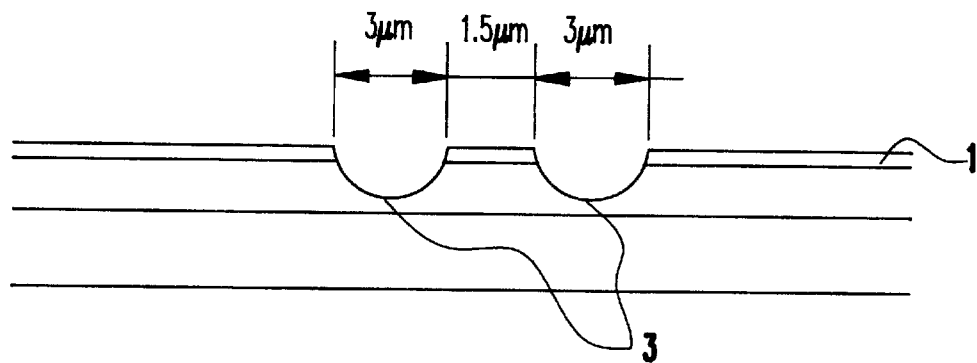
Figure 7C:
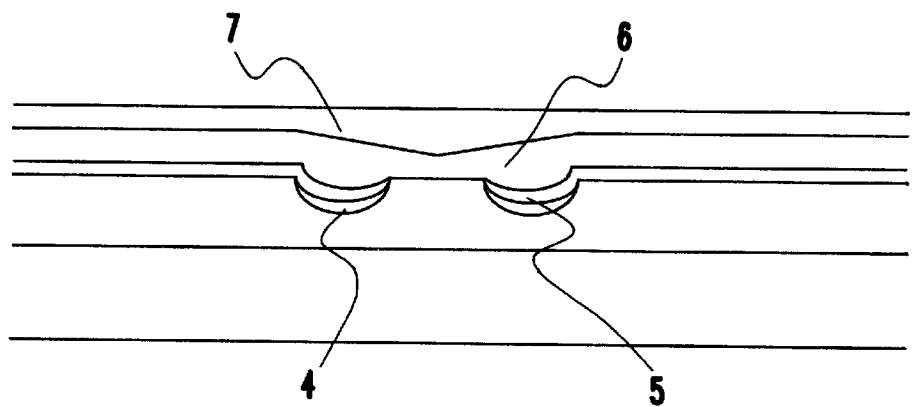
Figure 8A:
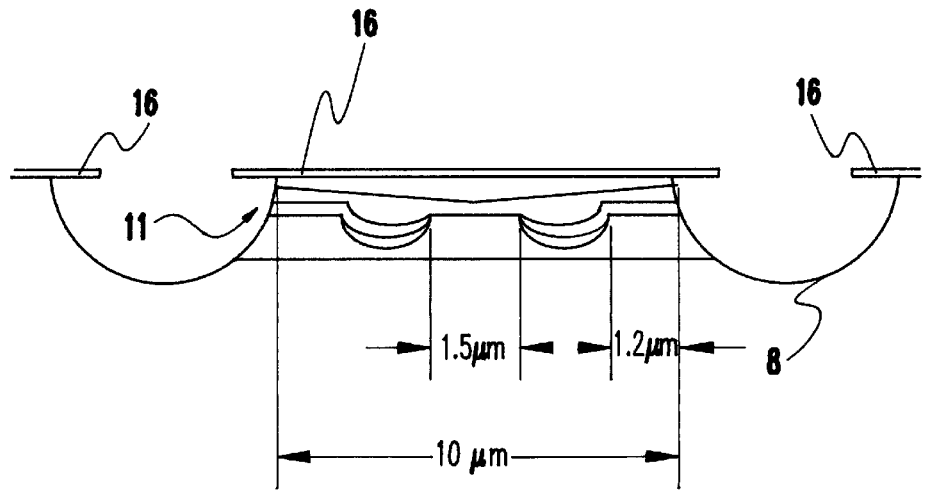
FIGS. 8(A), 8(B) and 8(C) are schematic sectional drawings for explaining a process for production of a semiconductor laser of the present invention.
Figure 8B:
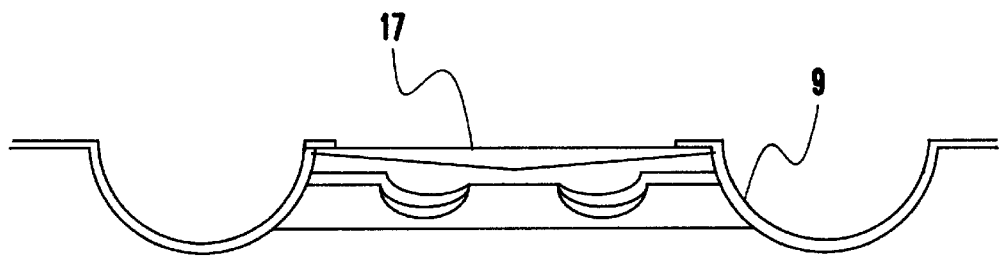
Figure 8C:
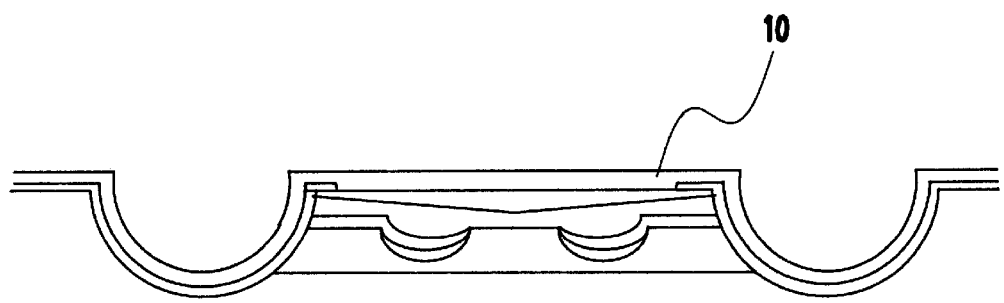
Figure 9:
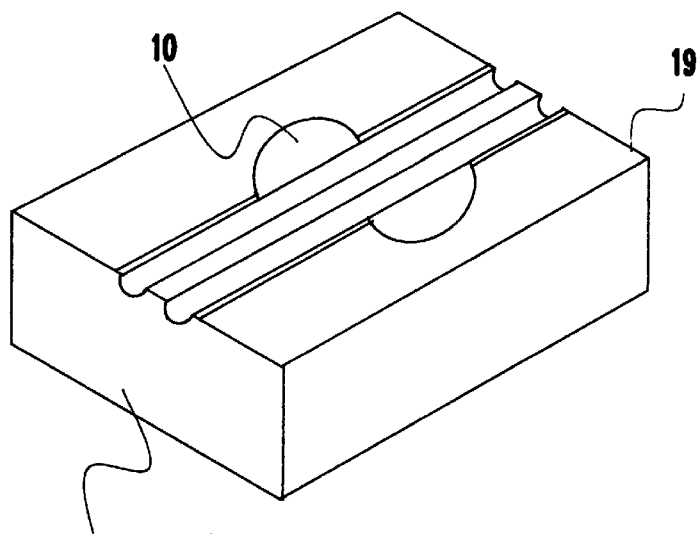
FIG. 9 is a drawing showing a semiconductor laser of the present invention.
Figure 10A:
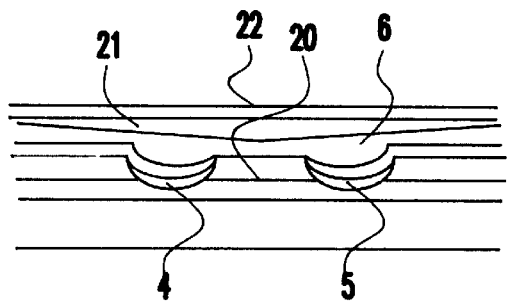
FIGS. 10(A) and 10(B) are schematic sectional drawings for explaining a process for production of a semiconductor laser of the present invention.
Figure 10B:
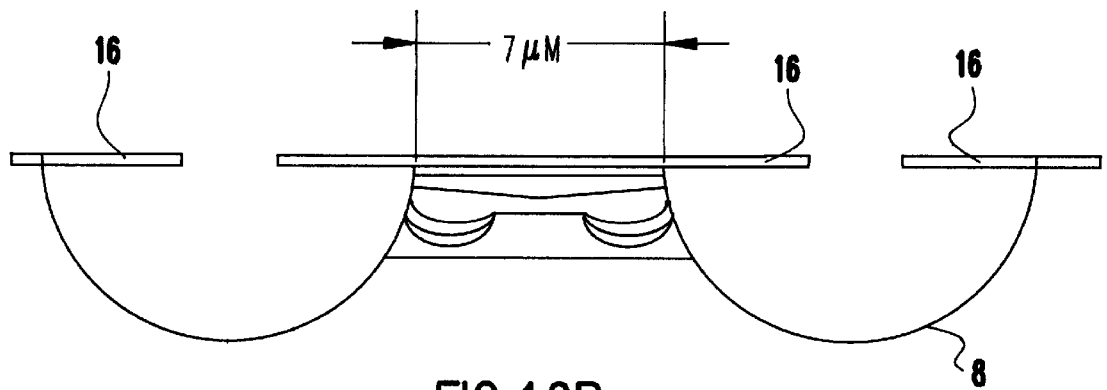
Figure 11:
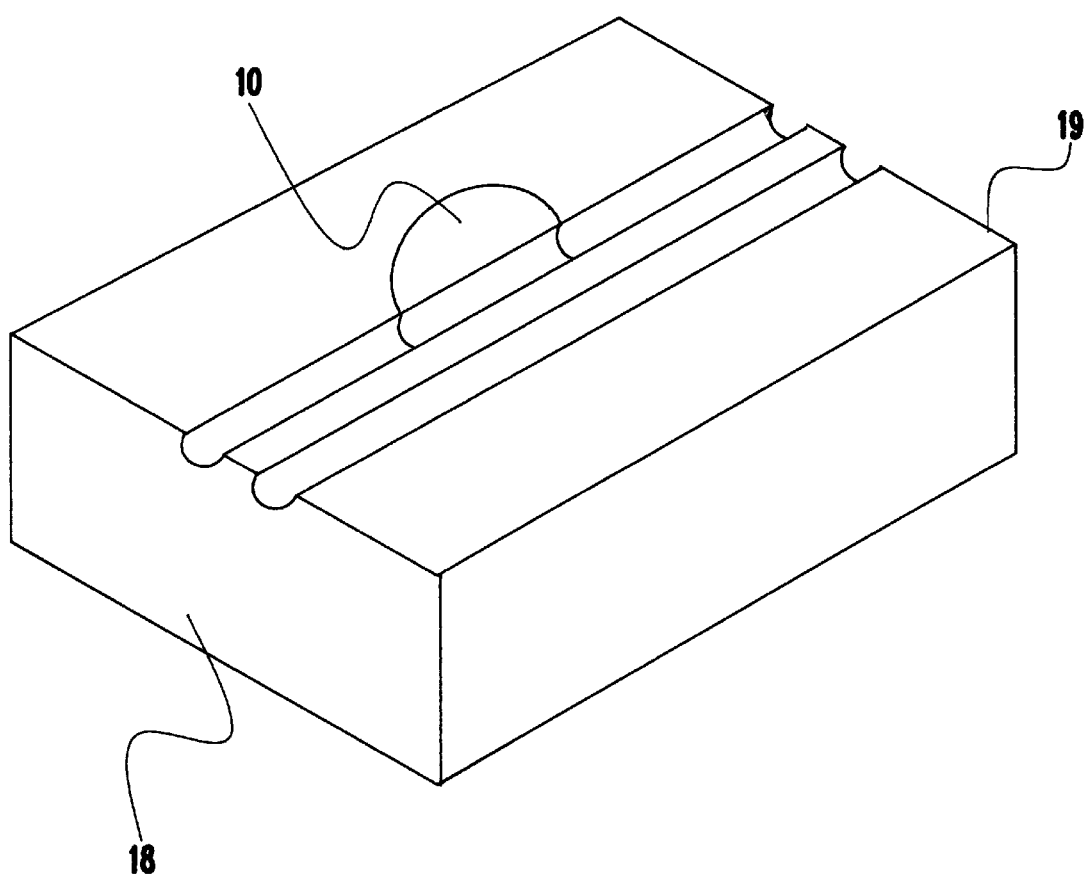
FIG. 11 is a drawing showing a semiconductor laser of the present invention.
Figure 12A:
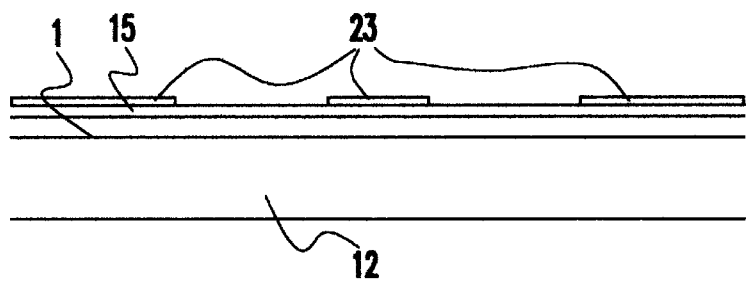
FIGS. 12(A), 12(B), 12(C), 12(D) and 12(E) are schematic sectional drawings for explaining a process for production of a semiconductor laser of the present invention.
Figure 12B:
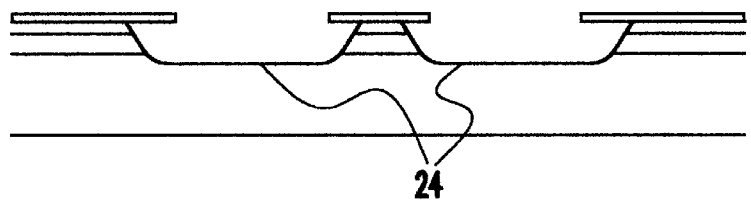
Figure 12C:
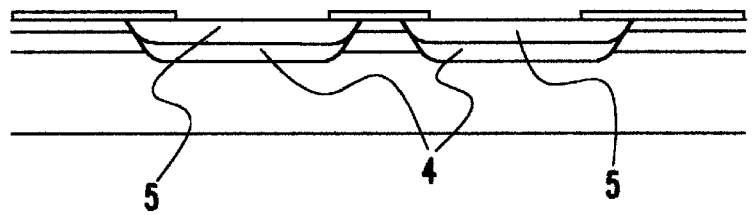
Figure 12D:
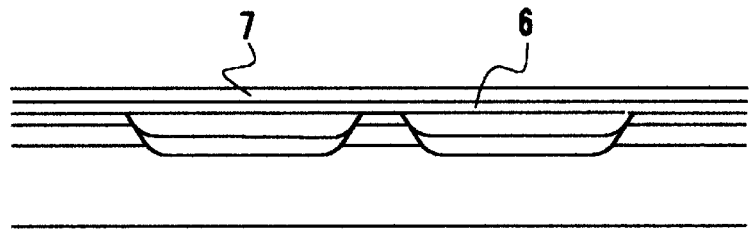
Figure 12E:
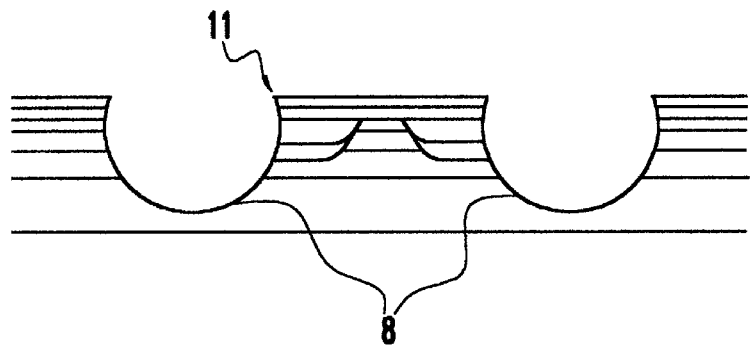
Figure 13A:
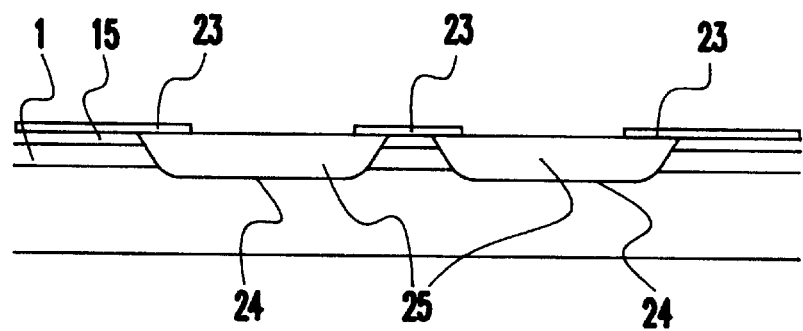
FIGS. 13(A), 13(B), and 13(C) are schematic sectional drawings for explaining a process for production of a semiconductor laser of the present invention.
Figure 13B:
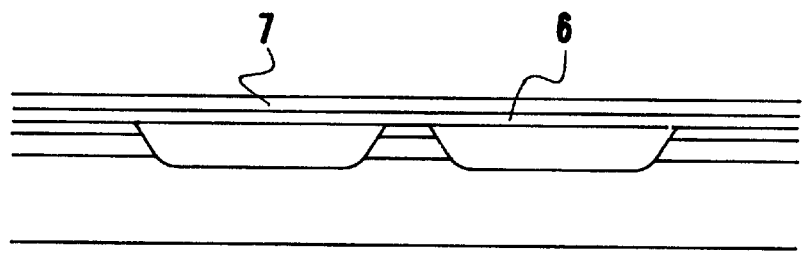
Figure 13C:
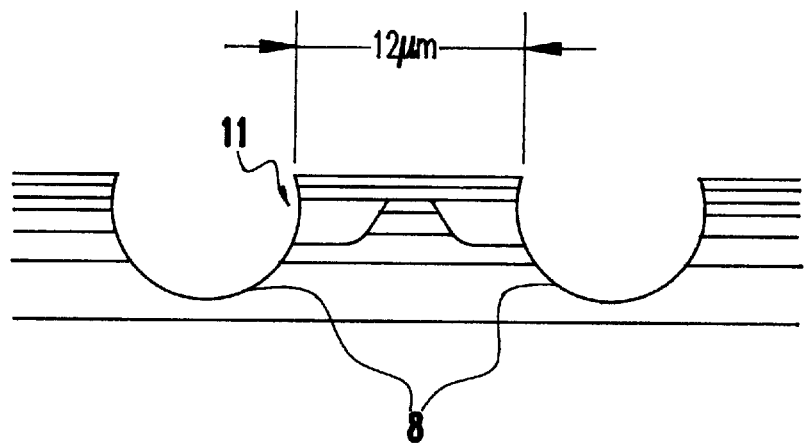
Figure 14A:
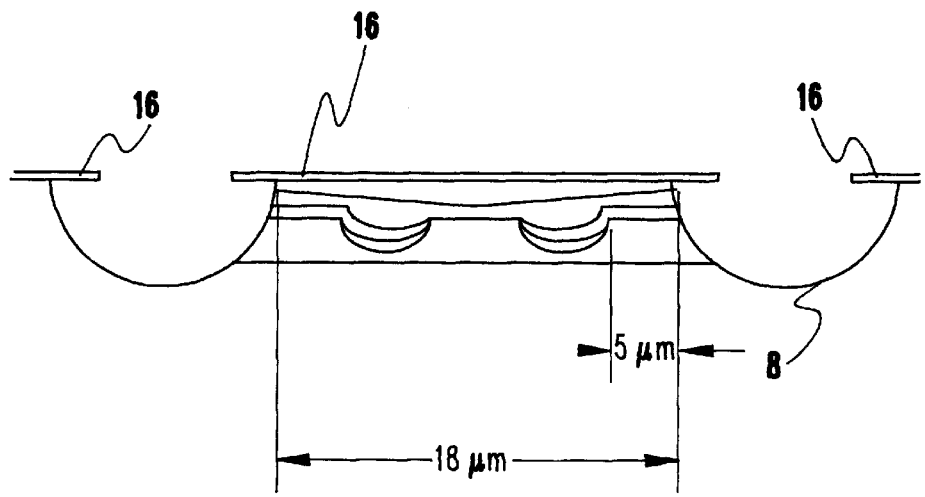
FIGS. 14(A), 14(B) and 14(C) are schematic sectional drawings for explaining a process for production of a semiconductor laser of the present invention.
Figure 14B:
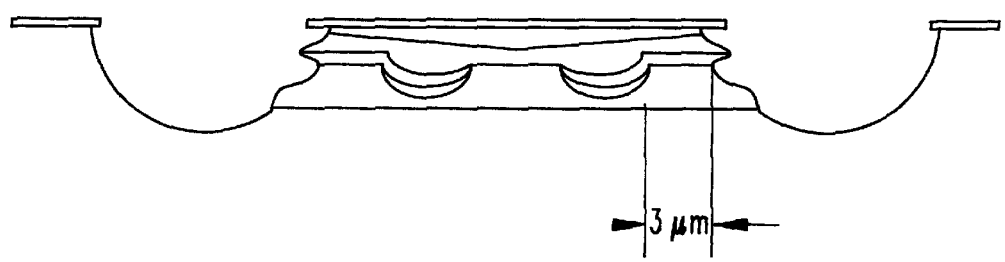
Figure 14C:
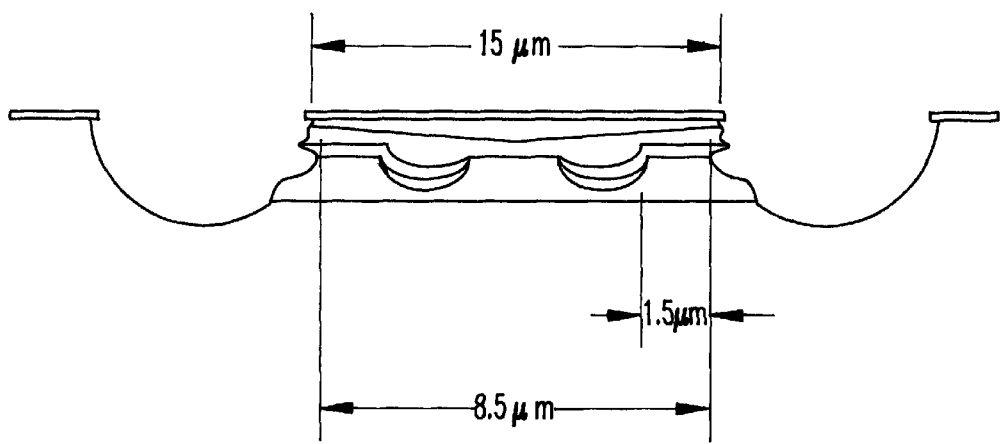
Figure 15A:
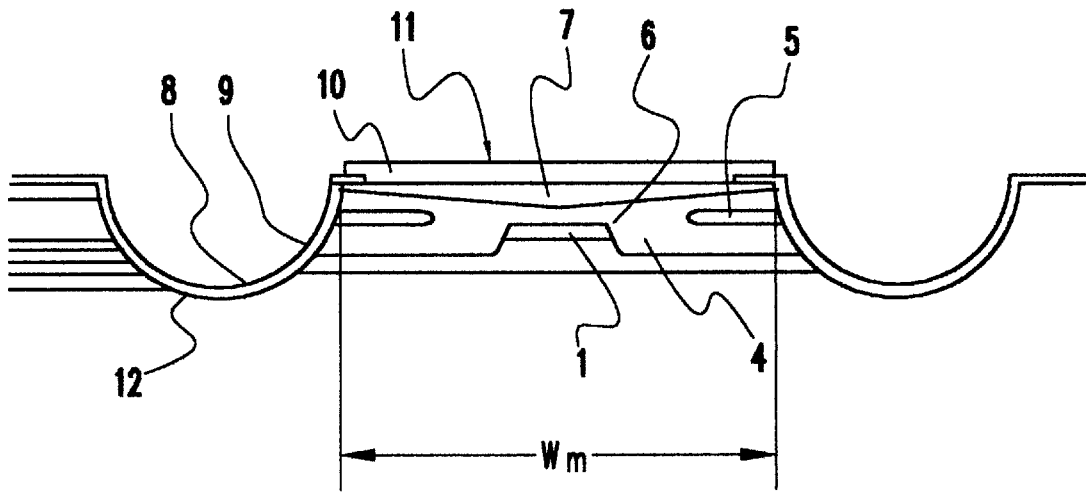
FIGS. 15(A) and 15(B) are schematic drawings each showing the sectional structure of a conventional semiconductor laser.
Figure 15B:
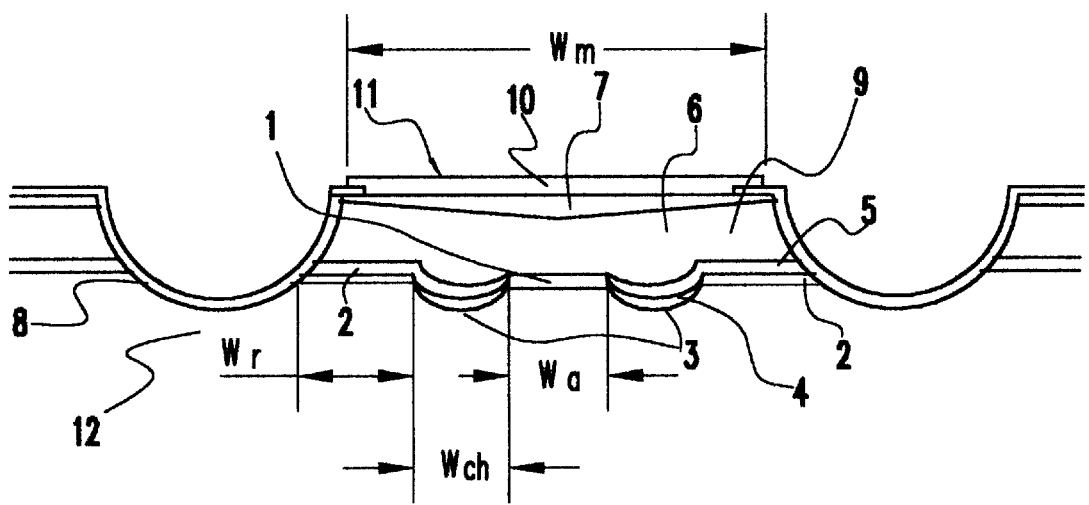

What is claimed is:

1. A DC-PBH semiconductor laser comprising:

a substrate;

two electrode-separating grooves formed in the substrate;

an electrode mesa formed between the two electrode-separating grooves, said electrode mesa including an active layer, one pair of channels provided at respective ends of the active layer, two recombination layers provided outside of said one pair of channels, wherein a width of the electrode mesa between the two electrode-separating grooves, at a position including the active layer, lies within a range of between 5 $\mu$m and 10 $\mu$m and wherein a width of each of said two recombination layers is 0.1 $\mu$m or more.

2. A DC-PBH semiconductor laser according to claim 1, wherein a first current-blocking layer having a conductivity type different from that of the substrate and a second current-blocking layer having a same conductivity type as the substrate are provided at each of two ends of the active layer, and wherein a distance between one end of the second current-blocking layer and one end of the active layer is set at 0.01 $\mu$m to 0.5 $\mu$m.

3. A DC-PBH semiconductor laser according to claim 1, wherein a width of a top of the electrode mesa is larger than the width of the electrode mesa at the position including the active layer.

4. A DC-PBH semiconductor laser according to claim 1, wherein the two recombination layers have a same layer structure as the active layer.

* * * * *